US012622228B2

(12) United States Patent
Peake et al.

(10) Patent No.: US 12,622,228 B2
(45) Date of Patent: May 5, 2026

(54) SEMICONDUCTOR DEVICE AND A METHOD FOR MANUFACTURING A SEMICONDUCTOR DEVICE

(71) Applicant: NEXPERIA B.V., Nijmegen (NL)

(72) Inventors: Steven Peake, Manchester (GB); Md Imran Siddiqui, Manchester (GB)

(73) Assignee: Nexperia B.V., Nijmegen (NL)

( * ) Notice: Subject to any disclaimer, the term of this patent is extended or adjusted under 35 U.S.C. 154(b) by 268 days.

(21) Appl. No.: 18/314,226

(22) Filed: May 9, 2023

(65) Prior Publication Data

US 2023/0369140 A1    Nov. 16, 2023

(30) Foreign Application Priority Data

May 10, 2022    (EP) .................................... 22172478

(51) Int. Cl.
| | |
|---|---|
| *H01L 21/66* | (2006.01) |
| *H01L 21/02* | (2006.01) |
| *H01L 21/3213* | (2006.01) |
| *H01L 21/763* | (2006.01) |
| *H10D 30/01* | (2025.01) |
| *H10D 30/66* | (2025.01) |
| *H10D 64/00* | (2025.01) |
| *H10D 64/01* | (2025.01) |

(52) U.S. Cl.
CPC ........ *H01L 22/26* (2013.01); *H01L 21/02238* (2013.01); *H01L 21/32137* (2013.01); *H01L 21/763* (2013.01); *H10D 30/0297* (2025.01); *H10D 30/668* (2025.01); *H10D 64/01* (2025.01); *H10D 64/117* (2025.01)

(58) Field of Classification Search
None
See application file for complete search history.

(56) References Cited

U.S. PATENT DOCUMENTS

2008/0296673 A1* 12/2008 Tai ..................... H10D 30/0297
                                                  257/E29.345
2022/0045181 A1*  2/2022 Song ..................... H10D 84/83

OTHER PUBLICATIONS

L. Hsu, "An optical interference model to analyze interferometry endpoint signal for process control of polysilicon gate etch", Semiconductor Manufacturing Technology Workshop Proceedings (IEEE Cat. No.04EX846), Hsinchu, Taiwan, 2004, pp. 111-114. (Year: 2004).*
T. Lill et al., "In situ measurement of aspect ratio dependent etch rates of polysilicon in an inductively coupled fluorine plasma", J. Vac. Sci. Technol. B19, pp. 2123-2128. (Year: 2001).*

* cited by examiner

*Primary Examiner* — Jiong-Ping Lu
(74) *Attorney, Agent, or Firm* — Ruggiero McAllister & McMahon LLC

(57) ABSTRACT

A method of creating a vertical semiconductor device, the method includes the steps of performing a LOCal Oxidation of Silicon, LOCOS, process in a vertical trench of a semiconductor material so that oxide material is formed inside the vertical trench, and ledges are formed by the oxide material, inside the vertical trench, as a result of the LOCOS process, so that a lower region of reduced lateral distance is formed between the oxide material, at a base of the trench, depositing the trench with polysilicon and etching the polysilicon downward up to the oxide material using interferometric end point detection, so that polysilicon remains in the lower region.

7 Claims, 4 Drawing Sheets

SEMICONDUCTOR DEVICE AND A METHOD FOR MANUFACTURING A SEMICONDUCTOR DEVICE

CROSS-REFERENCE TO RELATED APPLICATIONS

This application claims the benefit under 35 U.S.C. § 119(a) of European Application No. 22172478.4 filed May 10, 2022, the contents of which are incorporated by reference herein in their entirety.

BACKGROUND

1. Field of the Disclosure

The present disclosure generally relates to the field of semiconductor devices and, more specifically, to the field of manufacturing a semiconductor device having a vertical trench.

2. Description of the Related Art

The present disclosure is directed to vertical discrete semiconductor devices. A vertical discrete semiconductor device is a device that has a vertical channel structure such that the current flows vertically from one side of the silicon wafer to the opposing second side of the wafer.

One of such a semiconductor device is a (power) Metal Oxide Semiconductor, MOS, Field Effect Transistor, FET, typically comprises a source region towards a first major surface of the MOSFET and a drain region formed on a second major surface, opposite to the first major surface.

A channel-accommodating region, i.e. a body region, is provided between the source and drain region, which channel-accommodating region is of a different conductivity type to that of the source and drain region. A conductive channel is to be provided between the source region and the drain region to assure that the MOSFET is turned on. To facilitate the creation of such a channel, a trench gate electrode is provided close to, but not in electrical contact with, the channel-accommodating region.

Typical for the vertical structured MOSFET, or for any vertical semiconductor device, is that the current is conducted vertically from one surface to the other so as to achieve high drive capability. It may be realized by packing trenches on a chip, deep enough to cross the oppositely doped body region, i.e. channel-accommodating region, below the top surface.

The design of power MOSFETs was made possible by the evolution of MOSFET and complementary metal-oxide-semiconductor, CMOS, technology which is used for manufacturing of integrated circuits. The power MOSFET has similar operating principle as a low-power counterpart, a lateral MOSFET.

Lateral reduced surface field, RESURF, devices are also known in the art. The low on-resistance and the high breakdown voltage, BV, in lateral RESURF devices make them desirable for use in high voltage integrated circuit, HVIC, technologies. Although desirable, RESURF devices suffer from the unique requirement of accurate charge control and they are very sensitive to charge balance. Variations on charge control may lead to a lower BV causing limitations on the device performance. This control requirement complicates the manufacturability of RESURF devices. It is rather difficult to obtain a BV that is reproducible in fabrication.

In recent years, RESURF technology has extended to low voltage, for example 25V to 150V POWERMOS applications. The industry preferred technique of achieving low voltage RESURF utilises a trench network with two polysilicon regions biased at gate and source potentials, respectively.

This RESURF technology has matured greatly over the past decade and has become the industry's norm for achieving the required voltage rating, i.e. BVdss with very low specific Rdson's. What defines the voltage rating is the depth of the trench, particularly, the vertical length of the buried source polysilicon region. Essentially, you increase the depth of the trench and the vertical source polysilicon region to achieve a higher voltage rating.

To define the buried source polysilicon region, you need to etch the trench, deposit the dielectric liner and then deposit the polysilicon. The deposited polysilicon is then plasma etched.

The polysilicon region is etched to a depth defined by a timed etch. The dielectric oxide liner is then subsequentially etched with the polysilicon region acting as the mask for this etch. This process has a process control capability that results in an undesired variation of polysilicon and dielectric liner depth across a wafer.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

It is an object of the present disclosure to provide for a method of creating a vertical semiconductor device. It is a further object of the present disclosure to provide for a semiconductor device obtained via the corresponding method.

In a first aspect, there is provided a method of creating a vertical semiconductor device, the method comprising the steps of:

performing a LOCal Oxidation of Silicon, LOCOS, process in a vertical trench of a semiconductor material such that oxide material is formed inside the vertical trench, wherein ledges are formed by said oxide material, inside said vertical trench, as a result of said LOCOS process, so that a lower region of reduced lateral distance is formed between said oxide material, at a base of said trench, depositing said trench with polysilicon;

etching said polysilicon downward up to the oxide material using interferometric end point detection, such that polysilicon remains in said lower region.

The inventor has found that it may be beneficial to use interferometric end point detection during the etching process as this would improve the process control capability. That is, less variation of polysilicon, and dielectric liner depth, across a wafer is obtained. This will also be explained in more detail with reference to the figures.

In an interferometric end point detection, a light beam may be directed to a semiconductor substrate and a reflected light beam may emerge from the substrate. Constructive and destructive interference of portions of the reflected light beam over time may modulate the light beam to form interference fringes, such as intensity maxima and minima. The reflected light beam may be detected by a detector that generates an interference signal, which is monitored to determine an endpoint of the etching process. The reflection signal may exhibit fringes that arise from the interference between a primary reflection from the surface of the substrate and reflections from the first couple of layers. The interference fringes may be used, for example, to measure the etch rate, the etch depth, and determine whether an etching process end point has been reached, i.e. whether the etching process has reached the oxide material.

In an example, the method comprises, before performing said LOCOS process, and wherein said trench has a deposited oxide at a bottom of said trench and having an oxide layer at sidewalls of said trench, the step of:

depositing a nitride in said vertical trench.

A nitride layer may be deposited and a nitride spacer etch may be performed which preferentially etches the nitride perpendicular to the direction of the etch beam. That is, only nitride on the planar surface may be etched, whilst the nitride of the vertical surfaces may not be etched.

Subsequently a thermal oxidation process, i.e. LOCOS process, may be performed which extends the oxide at where the nitride is etched since the nitride will bend upwards.

As such, the method may comprise the step of:

etching a spacer by removing the nitride from above the deposited oxide at said bottom of said trench.

In another example, the step of etching said polysilicon comprises:

etching said polysilicon downward up to the oxide material using interferometric end point detection and, subsequently, etching further downward for a predetermined time period.

The inventors have found that it might be beneficial to etch a little bit further than when the oxide material is detected. The interferometric end point detection is thus used for detecting the oxide material, and the etching process is then continued for a couple of second to etch a little bit into the oxide material as well. This ensure that the etch depth is at least, to a certain extent, beyond the nitride.

The predetermined time period may, for example, be anywhere between 0.5-10 seconds, preferably somewhere between 0.5-3 seconds.

In a further example, the method comprises the additional steps of:

growing a further oxide on top of said polysilicon in said vertical trench, and depositing a further polysilicon on said further oxide in said vertical trench.

In another example, the semiconductor material is of N-type.

In a second aspect of the present disclosure, there is provided a semiconductor device created by a method in accordance with any of the previous examples.

It is noted that the advantages as explained with reference to the first aspect of the present disclosure, being the method of creating a semiconductor device, are also applicable to the second aspect of the present disclosure, being the corresponding semiconductor device.

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The above and other aspects of the disclosure will be apparent from and elucidated with reference to the examples described hereinafter.

DETAILED DESCRIPTION

Figure 1:
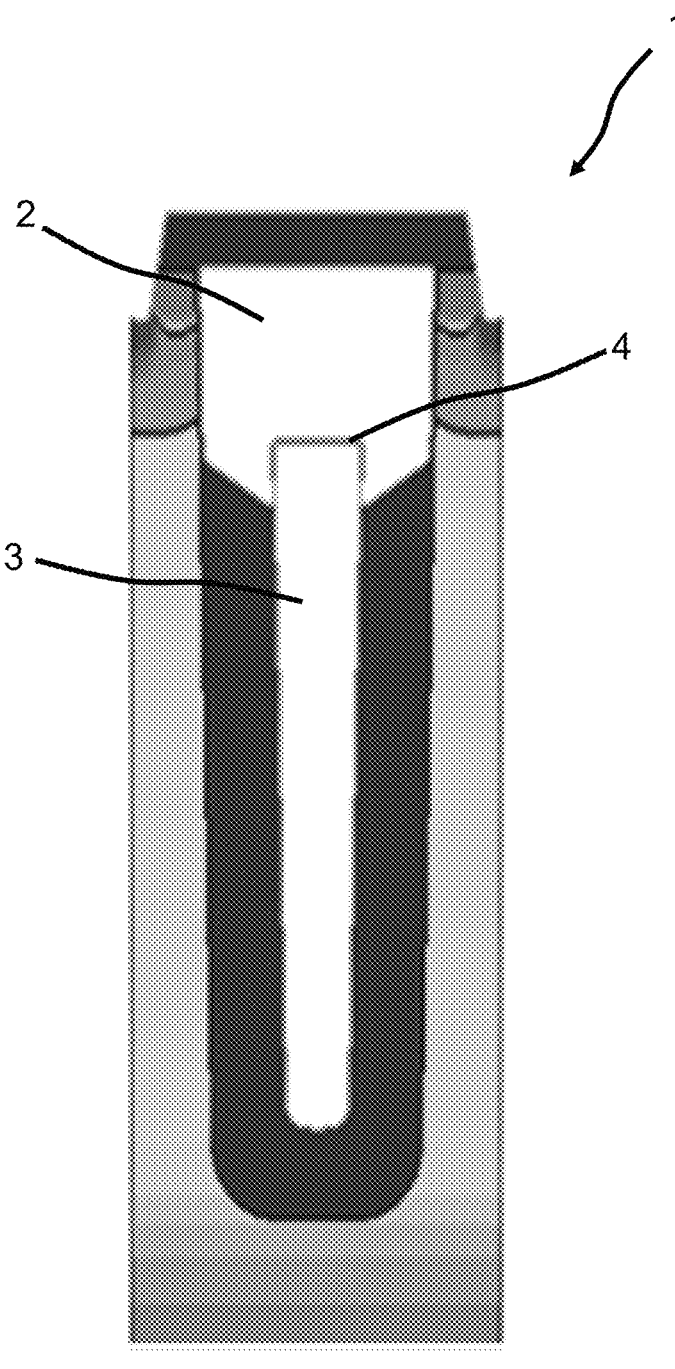
FIG. 1 discloses an example of a vertical semiconductor device in accordance with the present disclosure.

It is noted that in the description of the figures, same reference numerals refer to the same or similar components performing a same or essentially similar function.

A more detailed description is made with reference to particular examples, some of which are illustrated in the appended drawings, such that the manner in which the features of the present disclosure may be understood in more detail. It is noted that the drawings only illustrate typical examples and are therefore not to be considered to limit the scope of the subject matter of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively.

The word "or," in reference to a list of two or more items, covers all of the following interpretations of the word: any of the items in the list, all of the items in the list, and any combination of the items in the list.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

FIG. 1 discloses an example of a vertical semiconductor device in accordance with the present disclosure. More specifically, the example shown in FIG. 1 may be a Metal Oxide Semiconductor, MOS, Field Effect Transistor, FET.

As shown, the vertical semiconductor device 1 has two polysilicon regions. The first polysilicon region is indicated with reference numeral 2 and is typically biased at the gate potential of the MOSFET. The second polysilicon region is indicated with reference numeral 3 and is typically biased at the source potential of the MOSFET.

Such a design aids in improving the breakdown voltage of the MOSFET, i.e. the BVdss, and has a very low specific Rdson. The breakdown voltage of the MOSFET is defined, amongst other, by the depth of the trench and thus also the depth of the polysilicon region as indicated with reference numeral 3. If a higher breakdown voltage is required for a particular application, the depth of the trench may be increased, or may be in line with the use of a thicker epitaxial silicon layer.

Typically, to create such a double polysilicon region type of trench, a specific etch process is performed. Summarizing, first the trench is etched and oxide material is deposited. On top of the oxide material polysilicon material is deposited, which polysilicon material is to form the buried polysilicon region, i.e. the region having reference numeral 3. The deposited polysilicon is then again etched to a certain depth. On top of the polysilicon material an oxide layer is provided which is indicated with reference numeral 4. On top of the oxide material, a further polysilicon material is provided which is indicated with reference numeral 2. As such, two polysilicon material regions 2, 3 are provided which are isolated from one another via the oxide material having reference numeral 4.

Figures 2A, 2B:
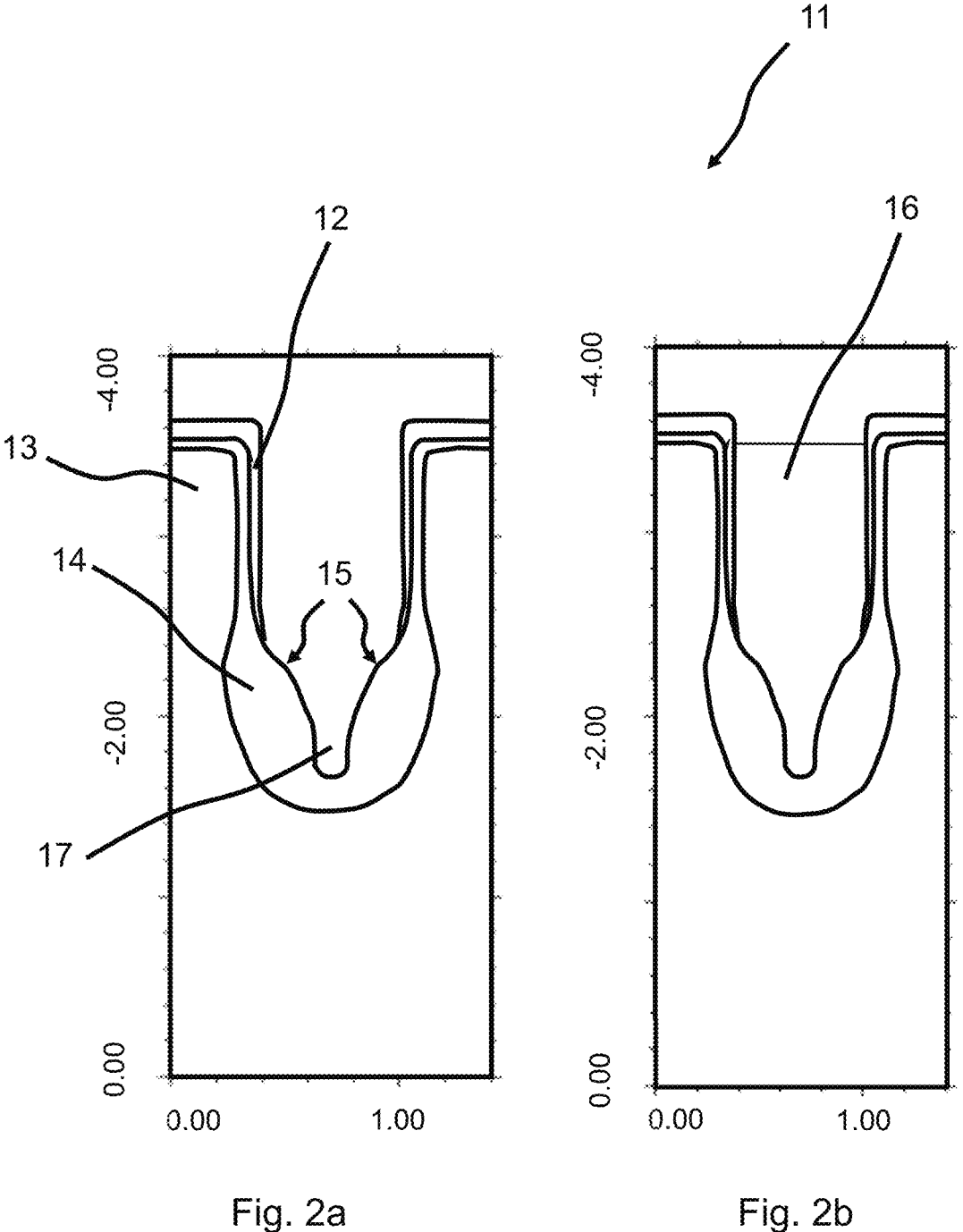
FIGS. 2a and 2b disclose an example of a process step in which ledges of oxide material are created, in accordance with the present disclosure.

FIGS. 2a and 2b disclose an example 11 of a process step in which ledges of oxide material are created, in accordance with the present disclosure.

This may be explained as follows. Just like a regular process, first the trench is etched in a semiconductor material 13. This may use some sort of timed etch like in prior art solutions. Then, oxide 14 may be deposited at a bottom of the trench and oxide layers 14 at sidewalls of the trench may be grown. A nitride 12 may be deposited in the vertical trench. The nitride is indicated with reference numeral 12.

Once the above is in place, a LOCal Oxidation of Silicon, LOCOS, process may be performed in the vertical trench of the semiconductor material 13. The oxide material 13 below the nitride 12 will grow and will form ledges as indicated with reference numeral 15. These ledges 15 are thus inside the vertical trench, and start just at the end of the nitride. It is noted that the nitride may also bend upwards a bit due to this process and thereby contributing to the formation of the ledges 15.

The ledges may have a gradual slope in that the thickness of the oxide material gradually becomes thicker. As such a lower region of reduced lateral distance is formed between the oxide material, at a base of the trench, as indicated with reference numeral 17.

Once the above described process is completed, the trench may be filled with polysilicon material 16 as indicated in FIG. 2b. This polysilicon material will, in the end, form the buried polysilicon region that is, for example, biased to the source potential of the MOSFET.

Figure 3:
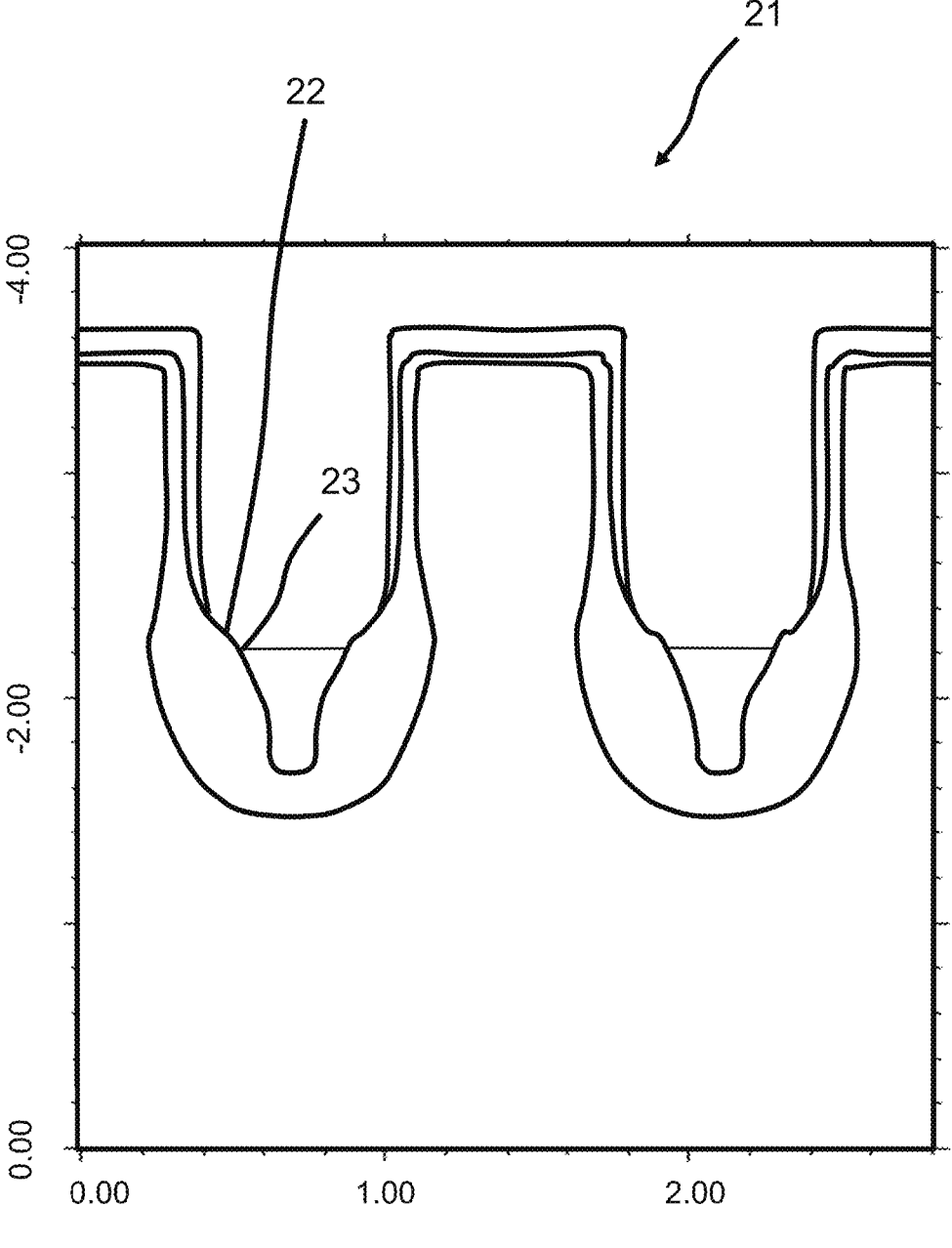
FIG. 3 discloses an example of a process step in which the polysilicon is etched using interferometric end point detection such that oxide material still remains in the base part of the trench.

FIG. 3 discloses an example 21 of a process step in which the polysilicon is etched using interferometric end point detection such that oxide material still remains in the base part of the trench.

The polysilicon 16 as shown in FIG. 2b is then etched downward as shown in FIG. 3. That is, the method comprises the step of etching said polysilicon downward up to the oxide material using interferometric end point detection 22, such that polysilicon remains in said lower region. In this particular example the etching is continued for a couple of second, i.e. a predefined time period, as indicated with reference numeral 23.

Figure 4:
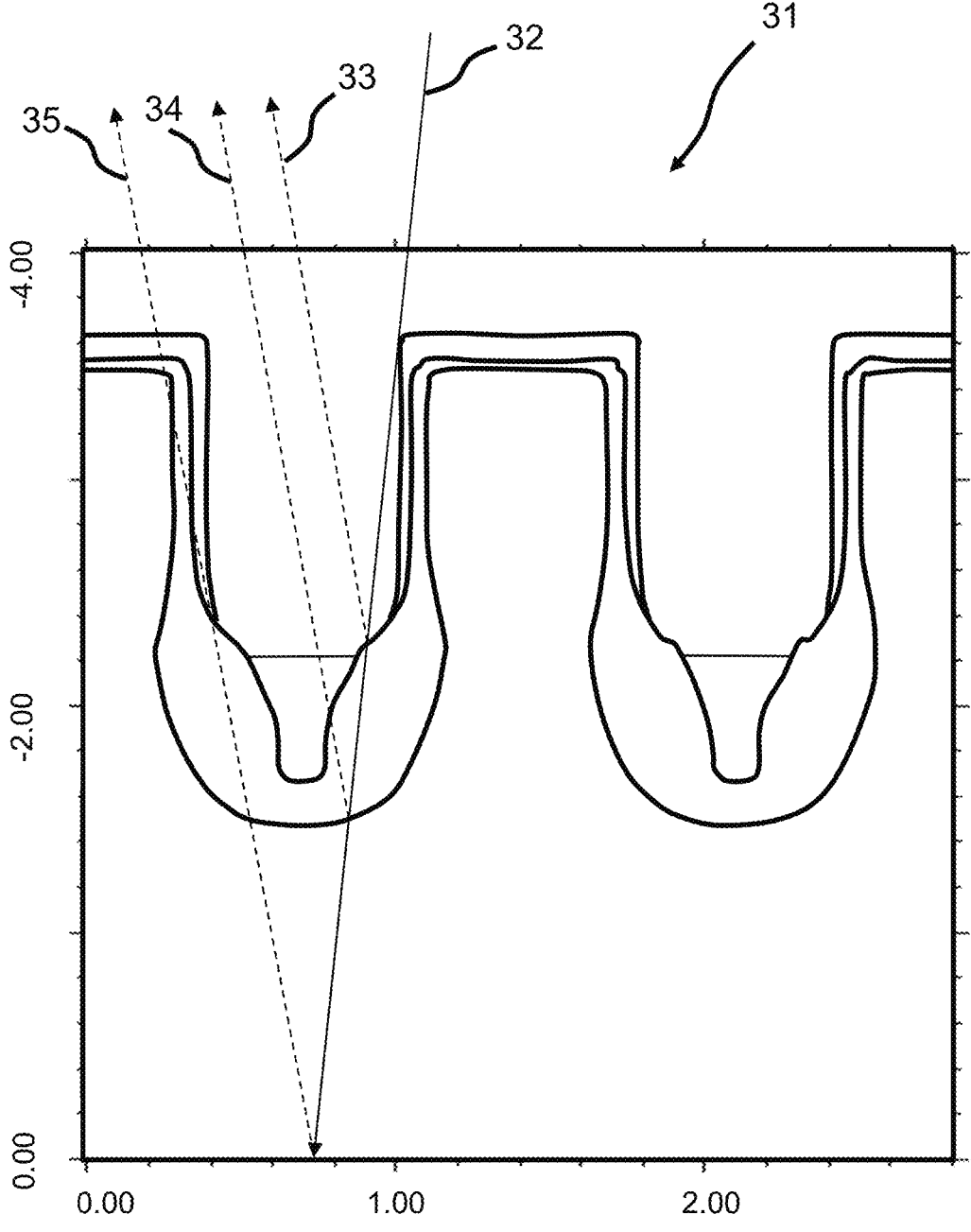
FIG. 4 shows an example in which interferometric end point detection is clarified.

FIG. 4 shows an example in which interferometric end point detection is clarified 31.

In an interferometric end point detection, a light beam 32 may be directed to a semiconductor substrate and a reflected light beam 33, 34, 35 may emerge from the substrate. Constructive and destructive interference of portions of the reflected light beam over time may modulate the light beam to form interference fringes, such as intensity maxima and minima.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

LIST OF REFERENCE NUMERALS

1. Vertical semiconductor device
2. First polysilicon region
3. Second polysilicon region
4. Oxide material
11. Example of process step
12. Nitride
13. Semiconductor material
14. Oxide
15. Ledges
16. Polysilicon material
17. Base of the trench
21. Example of process step
22. Interferometric end point detection
23. Time period
31. Example
32. Light beam
33. Reflected light beam
34. Reflected light beam
35. Reflected light beam

What is claimed is:

1. A method of creating a vertical semiconductor device, the method comprising the steps of:
   etching a vertical trench in a semiconductor material;
   depositing oxide at the bottom of the trench and forming an oxide layer at sidewalls of the trench;
   depositing nitride in the vertical trench;
   performing a LOCal Oxidation of Silicon (LOCOS) process in a vertical trench of a semiconductor material so that oxide material is formed inside the vertical trench, wherein the oxide material forms ledges, inside the vertical trench, as a result of the LOCOS process, so that a lower region of reduced lateral distance is formed between the oxide material, at a base of the trench and the ledges start at the end of the nitride,
   depositing the trench with polysilicon; and
   etching the polysilicon downward up to the oxide material using interferometric end point detection, so that polysilicon remains in the lower region, and subsequently, etching the polysilicon further downward for a predetermined time period after the oxide material is detected by the interferometric end point detection so that an etch depth is beyond the nitride.

2. The method according to claim 1, wherein the method comprises the additional steps of:
   growing a further oxide on top of the polysilicon in the vertical trench, and
   depositing a further polysilicon on the further oxide in the vertical trench.

3. The method according to claim 1, wherein the semiconductor material is of N-type.

4. The method according to claim 1, wherein the method further comprises the step of:
   etching a spacer by removing the nitride from above the deposited oxide at the bottom of the trench.

5. The method according to claim 4, further comprising the steps of:
   growing a further oxide on top of the polysilicon in the vertical trench, and
   depositing a further polysilicon on the further oxide in the vertical trench.

6. The method according to claim 4, wherein the semiconductor material is of N-type.

7. The method according to claim 1, wherein the predetermined time period is between 0.5-10 seconds.

* * * * *